United States Patent
Xu et al.

(10) Patent No.: US 10,991,584 B2
(45) Date of Patent: Apr. 27, 2021

(54) METHODS AND STRUCTURES FOR CUTTING LINES OR SPACES IN A TIGHT PITCH STRUCTURE

(71) Applicant: International Business Machines Corporation, Armonk, NY (US)

(72) Inventors: Peng Xu, Santa Clara, CA (US); Kangguo Cheng, Schenectady, NY (US); Choonghyun Lee, Rensselaer, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/846,711

(22) Filed: Dec. 19, 2017

(65) Prior Publication Data

US 2019/0189446 A1    Jun. 20, 2019

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0338; H01L 21/0335; H01L 21/0337
See application file for complete search history.

(56) References Cited

U.S. PATENT DOCUMENTS

| | | |
|---|---|---|
| 6,875,703 B1 | 4/2005 | Furukawa et al. |
| 8,153,519 B1 | 4/2012 | Yu |
| 8,796,085 B2 | 8/2014 | Koldiaev et al. |
| 8,828,876 B2 | 9/2014 | Horak et al. |
| 9,048,260 B2 | 6/2015 | Jhaveri et al. |
| 9,177,820 B2 | 11/2015 | Bergendahl et al. |
| 9,287,135 B1 | 3/2016 | Doris et al. |
| 9,679,771 B1 | 6/2017 | Chen |
| 9,685,440 B1 * | 6/2017 | Cheng ................ H01L 27/0886 |

(Continued)

OTHER PUBLICATIONS

K.G Anil et al., "CMP-less Integration of Fully Ni-Silicided Metal Gates in FinFETs by Simultaneous Silicidation of the Source, Drain, and the Gate Using a Novel Dual Hard Mask Approach," Symposium on VLSI Technology, Digest of Technical Papers, Jun. 14-16, 2005, pp. 198-199.

(Continued)

*Primary Examiner* — Bilkis Jahan
*Assistant Examiner* — Victor V Barzykin
(74) *Attorney, Agent, or Firm* — Randall Bluestone; Ryan, Mason & Lewis, LLP

(57) ABSTRACT

A method for manufacturing a semiconductor device includes forming a hardmask layer on a substrate, forming a plurality of spacers on the hardmask layer, wherein the plurality of spacers comprise a first set of spacers and a second set of spacers, reducing a height of each spacer of the second set of spacers to be less than a height of each spacer of the first set of spacers, removing one or more spacers from at least one of the first set of spacers and the second set of spacers, transferring a pattern of remaining spacers to the hardmask layer to form a plurality of patterned hardmask portions, and transferring a pattern of the plurality of patterned hardmask portions to the substrate to form one of a plurality of patterned substrate portions and a plurality of openings in the substrate.

18 Claims, 11 Drawing Sheets

(56) References Cited

U.S. PATENT DOCUMENTS

| | | | |
|---|---|---|---|
| 10,068,810 B1* | 9/2018 | Wu | H01L 21/845 |
| 10,096,483 B2* | 10/2018 | Zhou | H01L 21/30625 |
| 2006/0240361 A1 | 10/2006 | Lee et al. | |
| 2008/0008969 A1* | 1/2008 | Zhou | H01L 21/0337 |
| | | | 430/313 |
| 2011/0036396 A1 | 2/2011 | Jayaraman et al. | |
| 2012/0108070 A1 | 5/2012 | Kim | |
| 2013/0334602 A1* | 12/2013 | Guo | H01L 21/845 |
| | | | 257/347 |
| 2014/0099792 A1* | 4/2014 | Bergendahl | H01L 21/3086 |
| | | | 438/696 |
| 2014/0106523 A1 | 4/2014 | Koldiaev et al. | |
| 2014/0138797 A1* | 5/2014 | Cheng | H01L 21/3086 |
| | | | 257/618 |
| 2014/0167149 A1* | 6/2014 | Lee | H01L 29/7827 |
| | | | 257/330 |
| 2015/0056724 A1* | 2/2015 | Shieh | H01L 22/12 |
| | | | 438/14 |
| 2015/0170973 A1* | 6/2015 | Kim | H01L 21/82382 |
| | | | 438/702 |
| 2015/0311121 A1* | 10/2015 | Petrarca | H01L 21/82343 |
| | | | 438/283 |
| 2016/0240629 A1 | 8/2016 | Liou et al. | |
| 2017/0004973 A1* | 1/2017 | Kim | H01L 21/3086 |
| 2017/0125248 A1* | 5/2017 | Siew | H01L 21/0332 |
| 2017/0372909 A1* | 12/2017 | Briggs | H01L 21/3065 |
| 2018/0061658 A1* | 3/2018 | Mohanty | H01L 21/31144 |

OTHER PUBLICATIONS

H. Hody et al., "Double Patterning with Dual Hard Mask for 28-nm Node Devices and Below," Journal of Micro/Nanolithography, MEMS, and MOEMS, 041306, Oct. 1, 2013, 5 pages, vol. 12, No. 4.

* cited by examiner

US 10,991,584 B2

METHODS AND STRUCTURES FOR CUTTING LINES OR SPACES IN A TIGHT PITCH STRUCTURE

TECHNICAL FIELD

The field generally relates to semiconductor devices and methods of manufacturing same and, in particular, to techniques to form tight pitch structures by transferring patterns to a hardmask.

BACKGROUND

Semiconductor devices, such as, for example, complementary metal-oxide semiconductor (CMOS) devices are continuously being scaled down to smaller dimensions. As components are scaled down and devices are being formed closer together, improved processing for forming tight pitch structures are needed. Self-aligned multiple-patterning (SAMP), including, but not necessarily limited to, self-aligned double patterning (SADP), self-aligned quadruple patterning (SAQP) and self-aligned octuple patterning (SAOP), has been widely used to form tight pitch structures.

However, when using these SAMP techniques, it is difficult to achieve precisely formed lines or spaces in a tight pitch structure without compromising the structure and/or integrity of adjacent lines or spaces.

SUMMARY

According to an exemplary embodiment of the present invention, a method for manufacturing a semiconductor device includes forming a hardmask layer on a substrate, forming a plurality of spacers on the hardmask layer, wherein the plurality of spacers comprise a first set of spacers and a second set of spacers, reducing a height of each spacer of the second set of spacers to be less than a height of each spacer of the first set of spacers, removing one or more spacers from at least one of the first set of spacers and the second set of spacers, transferring a pattern of remaining spacers to the hardmask layer to form a plurality of patterned hardmask portions, and transferring a pattern of the plurality of patterned hardmask portions to the substrate to form one of a plurality of patterned substrate portions and a plurality of openings in the substrate.

According to an exemplary embodiment of the present invention, a method for manufacturing a semiconductor device includes forming a hardmask layer on a substrate, forming a plurality of mandrel portions on the hardmask layer, forming a plurality of spacers on sides of the plurality of mandrel portions, reducing a height of each spacer on a first side of each mandrel portion of the plurality of mandrel portions so that spacers on opposite sides of each mandrel portion have different heights from each other, removing one or more spacers of the plurality of spacers, transferring a pattern of remaining spacers to the hardmask layer to form a plurality of patterned hardmask portions, and transferring a pattern of the plurality of patterned hardmask portions to the substrate to form one of a plurality of patterned substrate portions and a plurality of openings in the substrate.

According to an exemplary embodiment of the present invention, a method for manufacturing a semiconductor device includes forming a plurality of amorphous silicon (a-Si) portions on a hardmask layer, forming a plurality of dielectric spacers on sides of the plurality of a-Si portions, reducing a height of each spacer on a first side of each a-Si portion of the plurality of a-Si portions so that spacers on opposite sides of each a-Si portion have different heights from each other, removing one or more spacers of the plurality of spacers, using a pattern of remaining spacers on the hardmask layer as masks, removing exposed portions of the hardmask layer to form a plurality of patterned hardmask portions, and forming one of a plurality of patterned substrate portions and a plurality of openings in the substrate corresponding to the plurality of patterned hardmask portions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
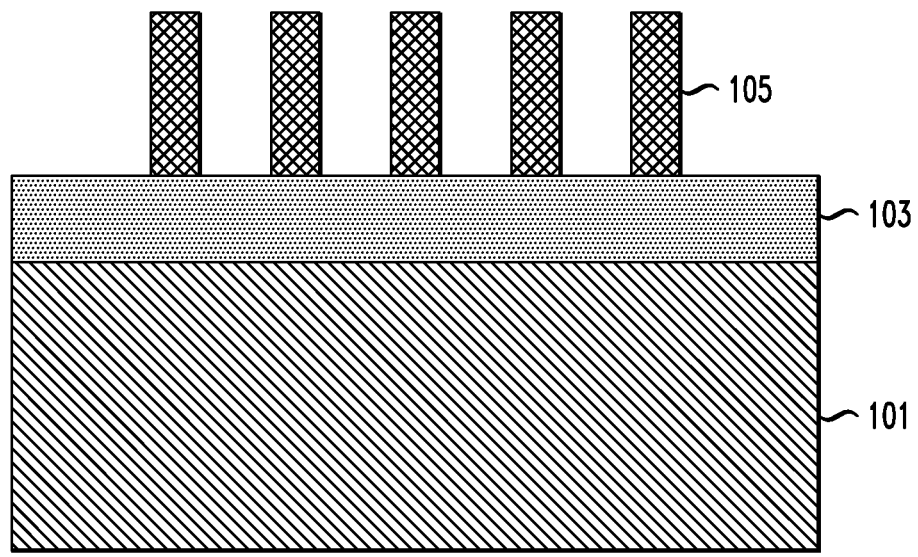
FIG. 1 is a cross-sectional view illustrating mandrel patterning on a hardmask layer in a method of manufacturing a semiconductor device, according to an exemplary embodiment of the present invention.

Exemplary embodiments of the invention will now be discussed in further detail with regard to semiconductor devices and methods of manufacturing same and, in particular, to the formation of tight pitch structures in a substrate corresponding to hardmask patterns.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 2:
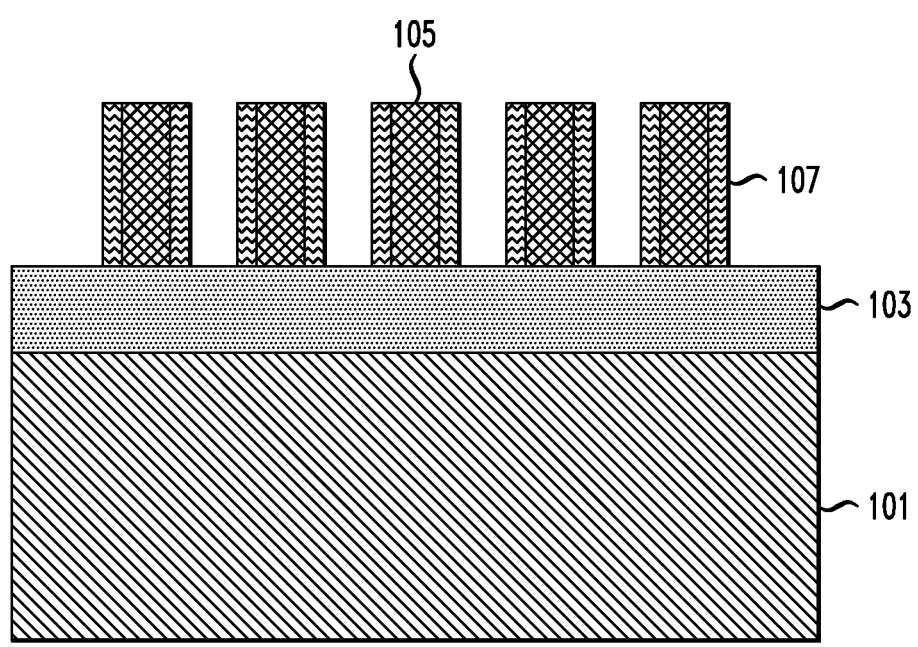
FIG. 2 is a cross-sectional view illustrating spacer formation in a method of manufacturing a semiconductor device, according to an exemplary embodiment of the present invention.

FIG. 1 is a cross-sectional view illustrating mandrel patterning on a hardmask layer, and FIG. 2 is a cross-sectional view illustrating spacer formation on sides of the mandrels in a method of manufacturing a semiconductor device, according to an exemplary embodiment of the present invention. Referring to FIGS. 1 and 2, a plurality of mandrels 105 comprising, but not necessarily limited to, amorphous silicon (a-Si), amorphous carbon, polycrystalline silicon, polycrystalline silicon germanium, amorphous silicon germanium, polycrystalline germanium, and amorphous germanium, are patterned on hardmask layer 103 on a substrate 101. The mandrel patterning can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (ME)) to form a mandrel 105. After the mandrel formation, a conformal film can be deposited and then followed by an etchback process (e.g., ME). The conformal film will form spacers 107 at both sides of each mandrel 105. The spacer material can include, but is not limited, an oxide, such as silicon oxide, formed by low-pressure chemical vapor deposition (LPCVD), plasma enhanced chemical vapor deposition (PECVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD). Alternatively, some other dielectric materials, such as SiOCN, SiCN, SiOC, can be used. A height of the mandrels 105 and corresponding spacers 107 can be in the range of, but is not necessarily limited to, 30 nm to 100 nm.

The hardmask layer 103 including, for example, a dielectric material, such as silicon nitride (SiN) is formed on the substrate 101 and can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess dielectric material. A height of the hardmask layer 103 can be in the range of, but is not necessarily limited to, 20 nm to 100 nm.

Depending on the application, the substrate 101 can include different materials. For example, in accordance with an embodiment of the present invention, the substrate 101 is formed of a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. Alternatively, the substrate 101 is formed of a dielectric material such as, but not necessarily limited to, low-k dielectric materials, such as, for example, a silicon oxycarbide, like SiOCH or any suitable dielectric. In some embodiments, the substrate 101 includes other device structures (not shown) such as transistors, isolation structures (such as shallow trench isolations), contacts, conducting wires, etc.

Figure 3:
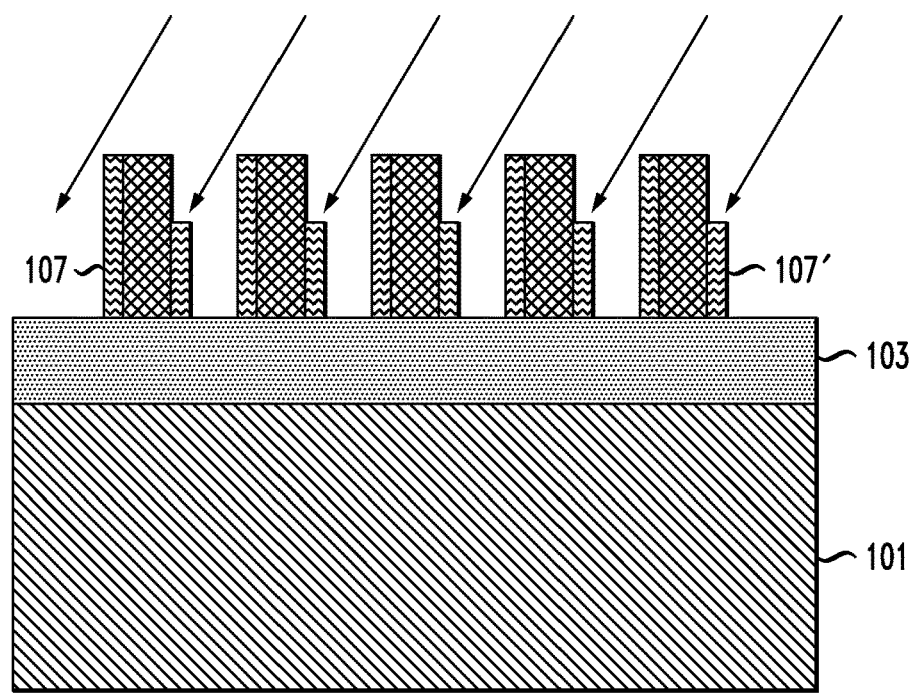
FIG. 3 is a cross-sectional view illustrating a tilt (e.g., angled) etch process to pattern a second set of the spacers to have a smaller height than a first set of the spacers in a method of manufacturing a semiconductor device, according to an exemplary embodiment of the present invention.

FIG. 3 is a cross-sectional view illustrating a tilt (e.g., angled) etch process to pattern a second set of the spacers to have a smaller height than a first set of the spacers in a method of manufacturing a semiconductor device, according to an exemplary embodiment of the present invention. Referring to FIG. 3, a tilt etch process, as shown by the angled arrows, reduces the height of a set of spacers 107' on one side of the mandrels 105 (referred to as "the second set of spacers") relative to the spacers 107 remaining at or near the original height of the spacers 107 on the other side of the mandrels 105 (referred to as "the first set of spacers"). In accordance with a non-limiting illustrative embodiment of the present invention, the height of each spacer 107' of the second set of spacers is reduced by more than ⅓ of its original height.

According to an embodiment of the present invention, the tilt etch process includes a gas cluster ion beam (GCIB) process, where the wafer on which the substrate 101 is positioned, is physically positioned (e.g., tilted) at an angle to permit angled ion implantation of a doping material to select ones or select portions of the oxide spacers 107. The doping material can include, for example, carbon, phosphorous, boron, and/or arsenic at concentrations of, for example, $1 \times 10^{19}$ cm$^{-3}$ to $2 \times 10^{22}$ cm$^{-3}$. The ion implanted spacer material is removed selective to the non-ion implanted spacer material to create the asymmetrical heights of the first and second sets of spacers 107 and 107' on opposite sides of each mandrel 105 as shown in FIG. 3. The selective removal can be performed using, for example, a wet etch process using hydrofluoric acid. Alternatively, the removal of a portion of the spacers can be achieved by angled ion bombardment in which high energy ions sputter away the spacer materials.

Figure 4:
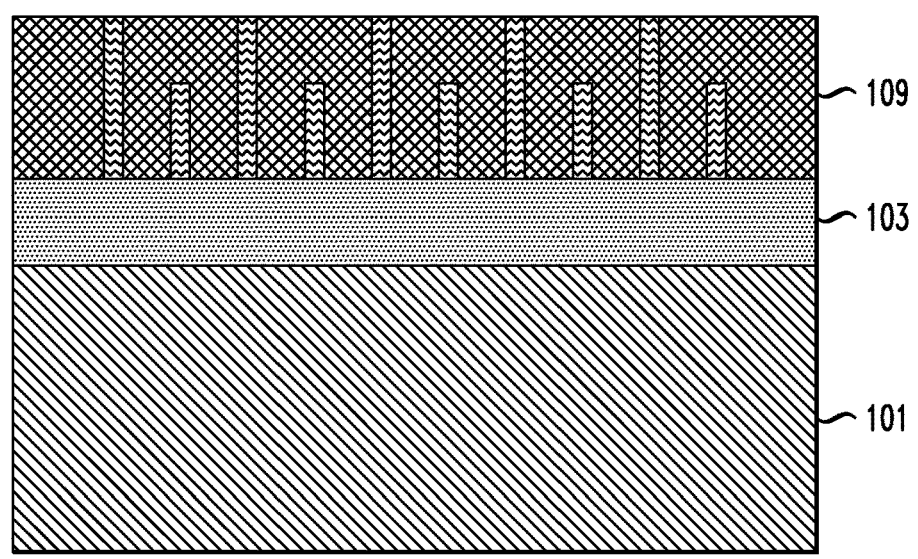
FIG. 4 is a cross-sectional view illustrating mandrel material deposition to fill in vacant areas on the hardmask layer and planarization in a method of manufacturing a semiconductor device, according to an exemplary embodiment of the present invention.

FIG. 4 is a cross-sectional view illustrating mandrel material deposition to fill in vacant areas on the hardmask layer and planarization in a method of manufacturing a semiconductor device, according to an exemplary embodiment of the present invention. Referring to FIG. 4, the mandrel material, such as a-Si, is deposited on the structure from FIG. 3 to create a layer 109 in which vacant areas on the hardmask layer 103 have been filled in. The deposited layer 109 is planarized to the top surface of the first set of spacers 107 and the top surface of the mandrels 105 to result in the structure shown in FIG. 4. The mandrel material can be deposited using deposition techniques, including, but not limited to, CVD, LPCVD, PECVD, LPCVD, RFCVD, PVD, ALD, MLD, MBD, PLD, LSMCD, spin-on, and/or sputtering, and the planarization can be performed using, for example, CMP.

Figure 5:
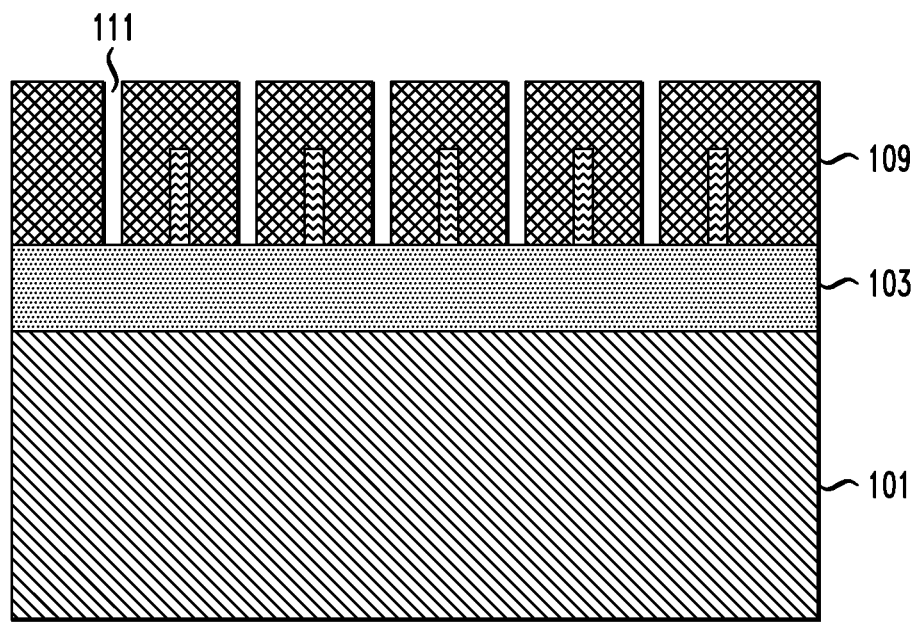
FIG. 5 is a cross-sectional view illustrating removal of the first set of set of spacers in a method of manufacturing a semiconductor device, according to an exemplary embodiment of the present invention.

FIG. 5 is a cross-sectional view illustrating removal of the first set of set of spacers (e.g., taller spacers) in a method of manufacturing a semiconductor device, according to an exemplary embodiment of the present invention. Referring to FIG. 5, top surfaces of the first set of spacers 107, which are at a greater height than the second set of spacers 107', are exposed at a top surface of the layer 109. An etching process that selectively removes a material of the spacers 107 (e.g., oxide) with respect to the mandrel material layer 109 (e.g. a-Si) is performed to create gaps 111 in the mandrel material layer 109. The selective removal can be performed using, for example, an oxide RIE process to remove the exposed oxide spacers selective to mandrel layers 109. Alternatively, a wet etch process using hydrofluoric acid can be used to remove oxide selective to a-Si, and is performed down to the hardmask layer 103.

Figure 6:
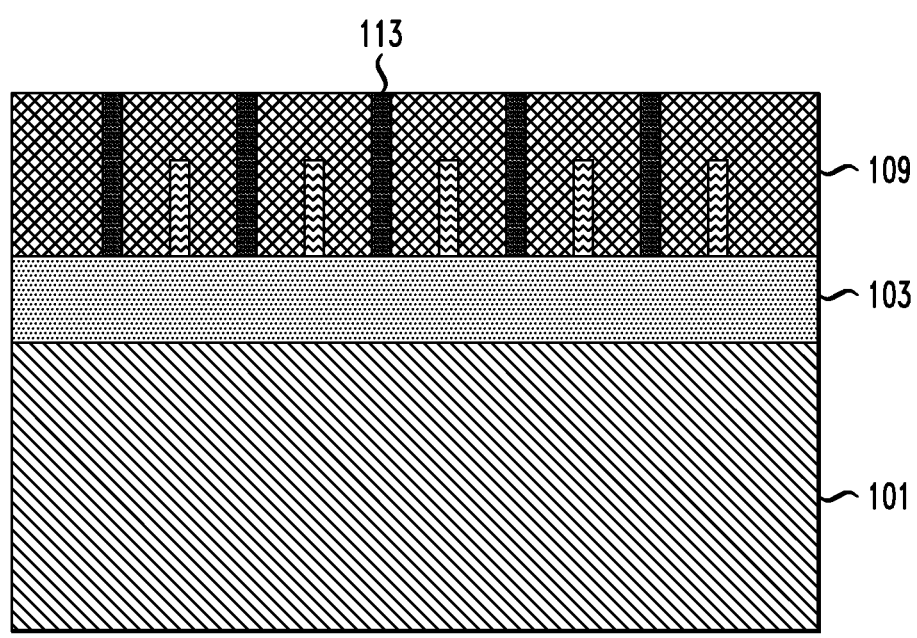
FIG. 6 is a cross-sectional view illustrating deposition of a gap fill material different from the spacer material to fill in gaps left by the removal of the first set of set of spacers in a method of manufacturing a semiconductor device, according to an exemplary embodiment of the present invention.

FIG. 6 is a cross-sectional view illustrating deposition of a gap fill material different from the spacer material to fill in gaps left by the removal of the first set of spacers in a method of manufacturing a semiconductor device, according to an exemplary embodiment of the present invention. Referring to FIG. 6, gap fill material 113 is deposited into the gaps 111 using deposition techniques, including, but not limited to, CVD, LPCVD, PECVD, RFCVD, PVD, ALD, MLD, MBD, PLD, LSMCD, spin-on, and/or sputtering. The deposition can be followed by a planarization process, such as CMP, in order to planarize a top surface of the gap fill material 113 to be coplanar with the top surface of the mandrel material layer 109 (e.g. a-Si). The gap fill material 113 is different from the material of the spacers 107' so that the gap fill material 113 and the material of the remaining second set of spacers 107' can be etched selectively with respect to each other. In accordance with an embodiment of the present invention, if the material of the spacers 107' is silicon oxide, then the gap fill material can be silicon carbon oxide (SiCO).

Figure 7:
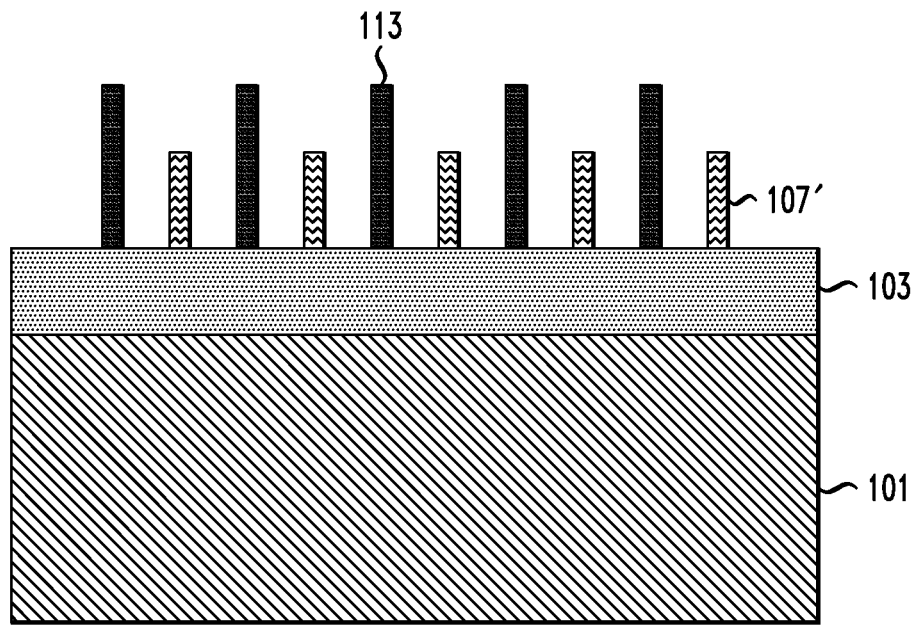
FIG. 7 is a cross-sectional view illustrating removal of mandrel material layer from on the hardmask layer in a method of manufacturing a semiconductor device, according to an exemplary embodiment of the present invention.

FIG. 7 is a cross-sectional view illustrating removal of the mandrel material layer from on the hardmask layer in a method of manufacturing a semiconductor device, according to an exemplary embodiment of the present invention. Referring to FIG. 7, the mandrel material layer 109 (e.g., a-Si) is removed from the hardmask layer 103 using any suitable etch process, for example, wet etch comprising nitric ($HNO_3$) and hydrofluoric (HF). Alternatively, a wet etch comprising ammonia or dry etch containing $SF_6$ can be used. As can be seen, the gap fill material 113 and the second set of spacers 107' remain on the hardmask layer 103.

Figure 8:
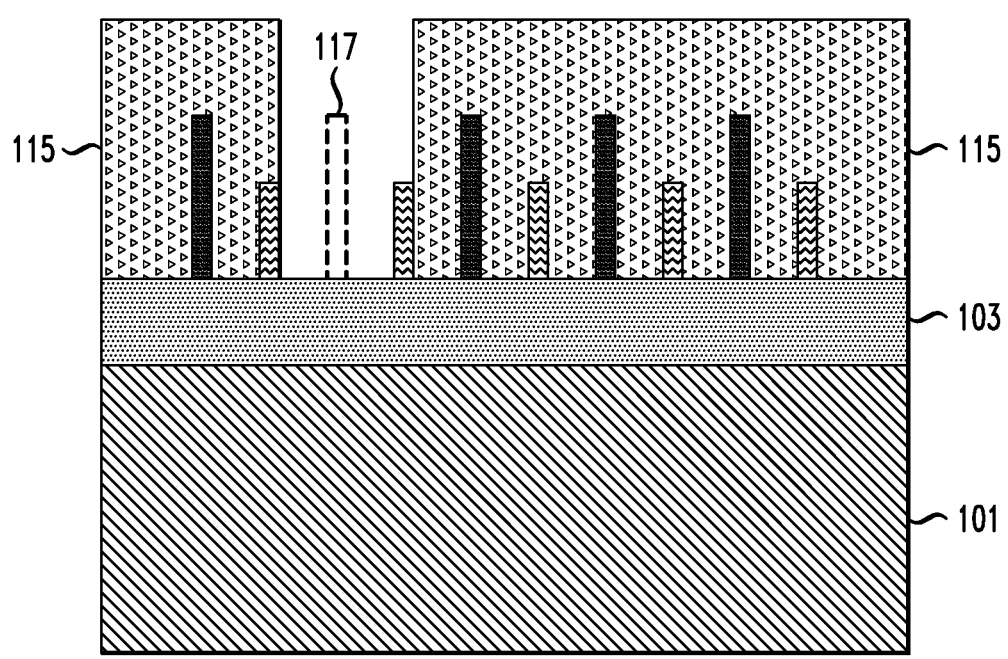
FIG. 8 is a cross-sectional view illustrating mask formation and selective removal of an exposed portion of the gap fill material in a method of manufacturing a semiconductor device, according to an exemplary embodiment of the present invention.

FIG. 8 is a cross-sectional view illustrating mask formation and selective removal of an exposed portion of the gap fill material in a method of manufacturing a semiconductor device, according to an exemplary embodiment of the present invention. Referring to FIG. 8, a mask 115, such as, for example, a photoresist including an optical planarization layer (OPL), is formed on the hardmask layer 103 and on and around the gap fill material portions 113 and the second set of spacers 107'. The mask 115 leaves exposed a gap fill material portion 113 that is to be removed. Depending on design constraints, and the desired resulting structure of lines and/or spaces (explained further herein below), any number of gap fill material portions 113 can be left exposed to be removed. Since the gap fill material is different from the material of spacers 107' and can be selectively removed with respect to the spacers 107', the mask 115 can leave exposed spacers 107' which are adjacent the gap fill material portions 113 that are to be removed. As shown by the phantom lines 117, the exposed gap fill material portion 113 is removed using an etching process which is selective with respect to the material of the spacers 107'. In accordance with an embodiment of the present invention, if the gap fill material includes SiCO, and the material of the spacers 107' includes an oxide, then the gap fill material portion 113 can be selectively etched using, for example, a dry etch process including hydrogen.

Figure 9:
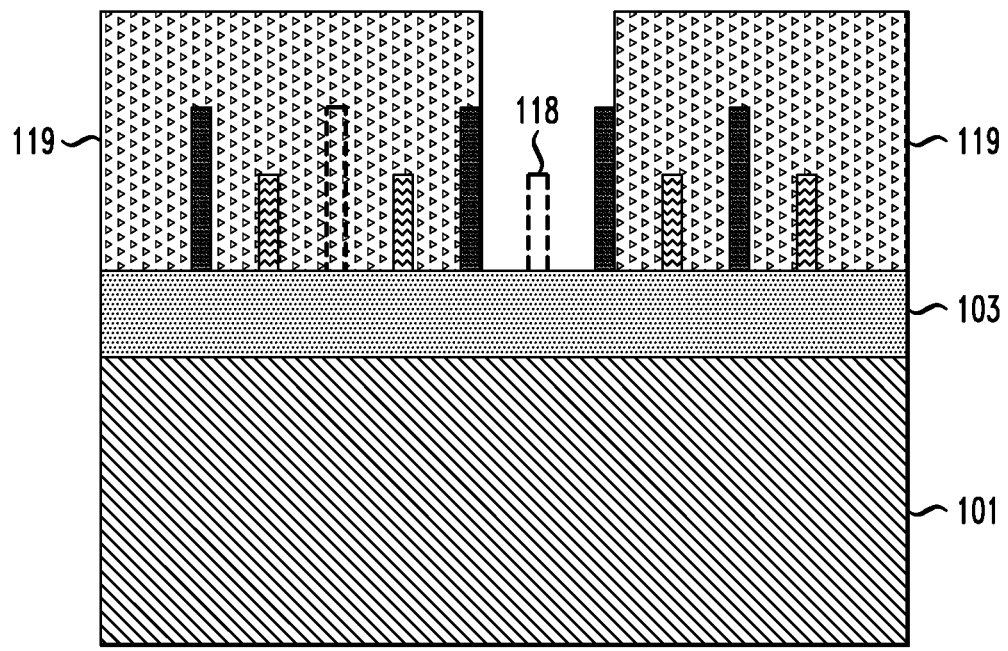
FIG. 9 is a cross-sectional view illustrating mask formation and selective removal of an exposed spacer from the second set of spacers in a method of manufacturing a semiconductor device, according to an exemplary embodiment of the present invention.

FIG. 9 is a cross-sectional view illustrating mask formation and selective removal of an exposed spacer from the second set of spacers in a method of manufacturing a semiconductor device, according to an exemplary embodiment of the present invention. Referring to FIG. 9, after the processing in FIG. 8, and removal of the mask 115, a mask 119, such as, for example, a photoresist including an optical planarization layer (OPL), is formed on the hardmask layer 103 and on and around the gap fill material portions 113 and the second set of spacers 107'. The mask 115 can be removed by, for example, oxygen plasma etch.

The mask 119 leaves exposed a spacer 107' that is to be removed. Depending on design constraints, and the desired resulting structure of lines and/or spaces (explained further herein below), any number of spacers 107' can be left exposed to be removed. Since the material of spacers 107' is different from the gap fill material and can be selectively removed with respect to the gap fill material, the mask 119 can leave exposed gap fill material portions 113 which are adjacent the spacers 107' that are to be removed. As shown by the phantom lines 118, the exposed spacer 107' is removed using an etching process which is selective with respect to the gap fill material. In accordance with an embodiment of the present invention, if the material of the spacers 107' includes an oxide and the gap fill material includes SiCO, then the spacer 107' can be selectively etched using, for example, a wet etch process including hydrofluoric acid (HF).

Figure 10:
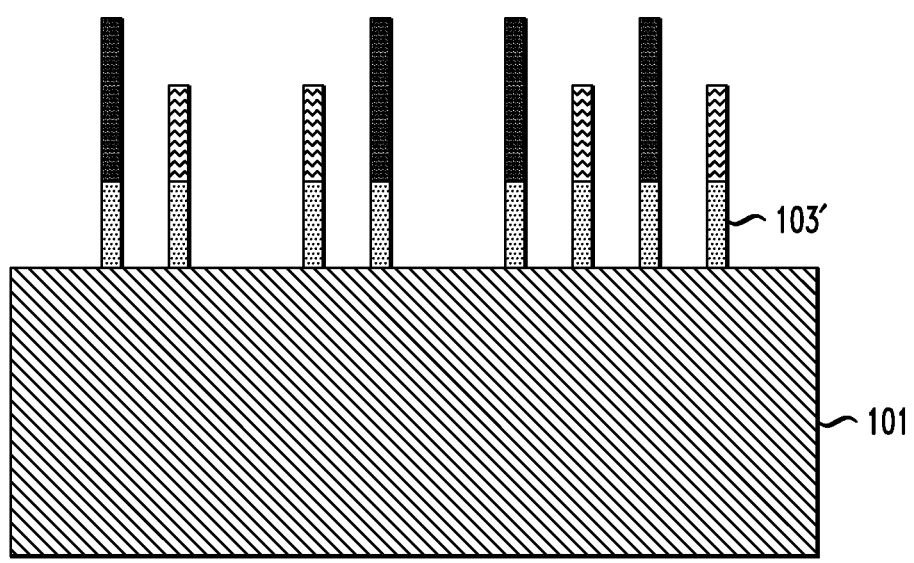
FIG. 10 is a cross-sectional view illustrating mask removal and removal of exposed portions of the hardmask layer not covered by the remaining gap fill material portions and the second set of spacers in a method of manufacturing a semiconductor device, according to an exemplary embodiment of the present invention.

FIG. 10 is a cross-sectional view illustrating mask removal and removal of exposed portions of the hardmask layer not covered by the remaining gap fill material portions and the second set of spacers in a method of manufacturing a semiconductor device, according to an exemplary embodiment of the present invention. Referring to FIG. 10, the mask 119 is removed using, for example, by, for example, oxygen plasma etch. Then, using the remaining gap fill material portions 113 and the remaining second set of spacers 107' as masks, exposed portions of the hardmask layer 103 not covered by the remaining gap fill material portions 113 and the remaining second set of spacers 107' are removed using a hardmask etch. The hardmask etch transfers the pattern of the remaining gap fill material portions 113 and the remaining second set of spacers 107' to the hardmask layer to form patterned hardmask portions 103'. In accordance with an embodiment of the present invention, hardmask layer 103 including SiN can be selectively etched with respect to the gap fill material portions 113 and the spacers 107' using, for example, reactive ion etch of silicon nitride.

Figure 11:
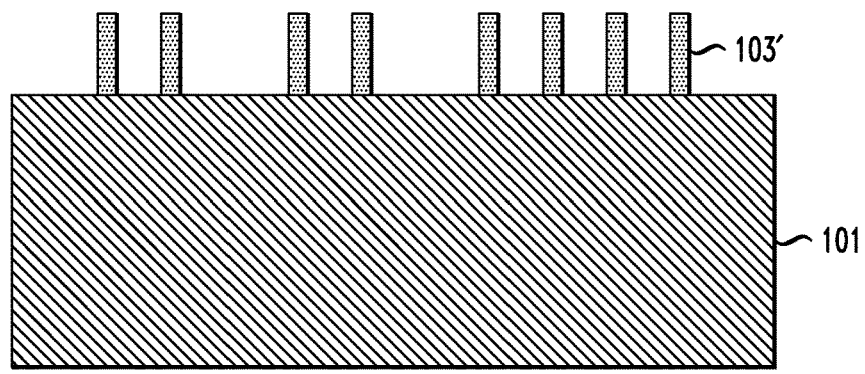
FIG. 11 is a cross-sectional view illustrating removal of the remaining gap fill material portions and the second set of spacers in a method of manufacturing a semiconductor device, according to an exemplary embodiment of the present invention.

FIG. 11 is a cross-sectional view illustrating removal of the remaining gap fill material portions and the second set of spacers in a method of manufacturing a semiconductor device, according to an exemplary embodiment of the present invention. Referring to FIG. 11, the remaining gap fill material portions 113 and the remaining second set of spacers 107' are removed from the patterned hardmask portions 103' using any suitable etch process, for example, a wet etch process including hydrofluoric acid (HF).

Figure 12:
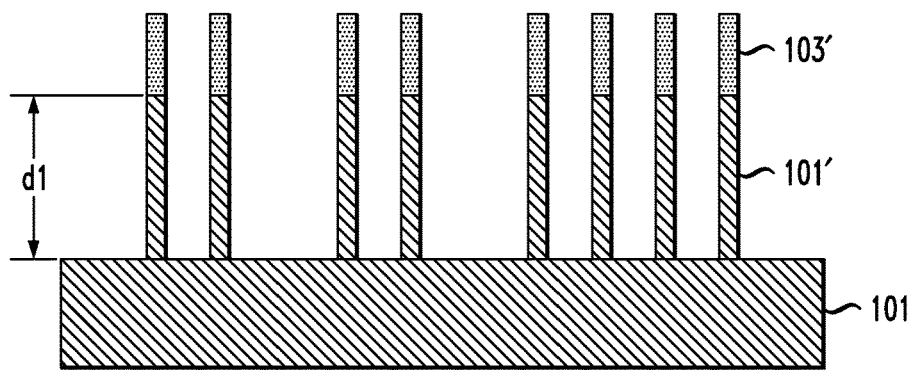
FIG. 12 is a cross-sectional view illustrating removal of exposed portions of the substrate not covered by the remaining portions of the hardmask layer to form lines in a method of manufacturing a semiconductor device, according to an exemplary embodiment of the present invention.

FIG. 12 is a cross-sectional view illustrating removal of exposed portions of the substrate not covered by the remaining portions of the hardmask layer to form lines in a method of manufacturing a semiconductor device, according to an exemplary embodiment of the present invention. Referring to FIG. 12, using the patterned hardmask portions 103' as masks, exposed portions of the substrate 101 not covered by the hardmask portions 103' are removed to certain depth d1 (depending on design) using a substrate etch. The substrate etch transfers the pattern of the remaining hardmask portions 103' to the substrate to form patterned substrate portions 101'. In accordance with an embodiment of the present invention, substrate 101 including a semiconductor material, such as, Si, SiGe, SiC, Si:C, SiGeC, SiGe:C, III-V, II-V compound semiconductor or other like semiconductor, can be selectively etched with respect to the hardmask portions 103' using, for example, a silicon RIE process, and substrate 101 including a dielectric material, such as, but not necessarily limited to, SiOCH can be selectively etched with respect to the hardmask portions 103' using, for example, $CF_4$ or $N_2/H_2$ plasma.

In the embodiment described in connection with FIG. 12, the processing forms "lines" in a tight pitch structure without compromising the structure and/or integrity of adjacent lines. Depending on the material of the substrate 101, and, therefore, the resulting material of the lines 101', the lines 101' can form, for example, semiconductor fins or other semiconductor structures at a close pitch with respect to each other. Alternatively, if the substrate 101 is a dielectric material, the lines 101' may form isolation regions or other insulating structures for semiconductor device at a close pitch with respect to each other. The close (or tight) pitch can be for example, 20 nm to 60 nm between adjacent lines.

Figure 13:
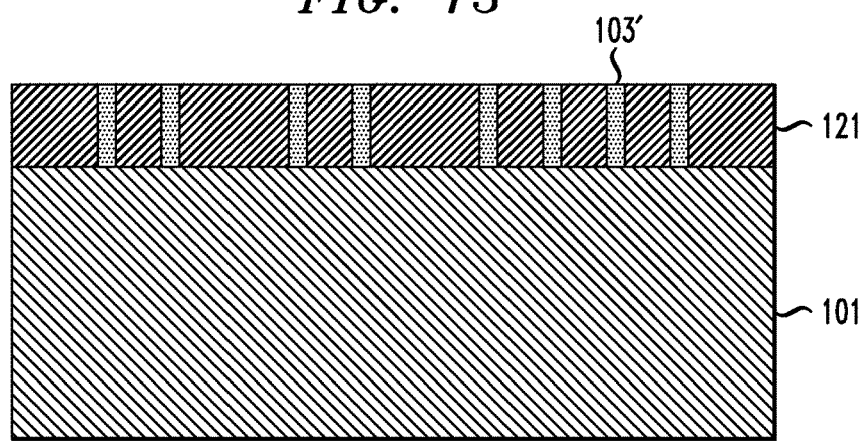
FIG. 13 is a cross-sectional view illustrating formation of a dielectric layer on the substrate and around remaining portions of the hardmask layer in a method of manufacturing a semiconductor device, according to an exemplary embodiment of the present invention.

FIG. 13 is a cross-sectional view illustrating formation of a dielectric layer on the substrate and around remaining portions of the hardmask layer in a method of manufacturing a semiconductor device, according to an exemplary embodiment of the present invention. Following from FIG. 11, a dielectric layer 121 is formed on the substrate 101 and around remaining hardmask layer portions 103'. The dielectric layer 121 can comprise a material so that the hardmask layer portions 103' can be selectively removed with respect to the dielectric layer 121. For example, according to an embodiment of the present invention, the dielectric layer 121 comprises an oxide, and the hardmask layer portions 103' comprise SiN.

The dielectric layer 121 can be deposited using deposition techniques, including, but not limited to, CVD, LPCVD, PECVD, RFCVD, PVD, ALD, MLD, MBD, PLD, LSMCD, spin-on, and/or sputtering. The deposition can be followed by a planarization process, such as CMP, in order to planarize a top surface of the dielectric layer 121 to be coplanar with the top surfaces of the hardmask layer portions 103'.

Figure 14:
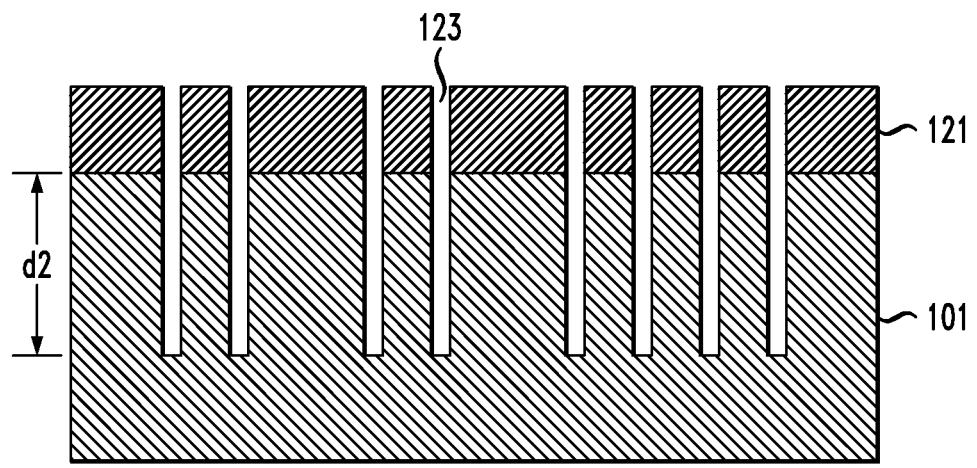
FIG. 14 is a cross-sectional view illustrating removal of the remaining portions of the hardmask layer and underlying portions of the substrate to form spaces (e.g., vacant areas) in a method of manufacturing a semiconductor device, according to an exemplary embodiment of the present invention.

FIG. 14 is a cross-sectional view illustrating removal of the remaining portions of the hardmask layer and underlying portions of the substrate to form spaces (e.g., vacant areas) in a method of manufacturing a semiconductor device, according to an exemplary embodiment of the present invention. Referring to FIG. 14, the hardmask layer portions 103' (e.g., SiN) are selectively removed with respect to the dielectric layer 121 (e.g., oxide) using, for example, a wet etch process including phosphoric acid, to form trenches in the dielectric layer 121.

The exposed portion of the substrate 101 (exposed by the trenches formed by the removal of the hardmask layer portions 103') are then removed down to a depth d2 (depending on design) using a substrate etch to form the openings 123, effectively transferring the pattern of the hardmask layer portions 103' to the substrate 101. Depending on the material of the substrate 101, the etching of the substrate 101 to form openings 123 is selective with respect to the material of the dielectric layer 121. In accordance with an embodiment of the present invention, substrate 101 including a semiconductor material, such as, Si, SiGe, SiC, Si:C, SiGeC, SiGe:C, III-V, II-V compound semiconductor or other like semiconductor, can be selectively etched with respect to the dielectric layer 121 using, for example, a silicon RIE process, and substrate 101 including a dielectric material, such as, but not necessarily limited to, SiOCH can be selectively etched with respect to the dielectric layer 121 using, for example, $CF_4$ or $N_2/H_2$ plasma. In some embodiments, the formed trenches are filled with dielectric or conducting materials (not shown). For example, the trenches can be filled with dielectric so that those trenches can be used as trench isolation to isolate adjacent devices. Alternatively, trenches can be filled with conducting materials to form interconnection among devices.

In the embodiment described in connection with FIG. 14, the processing forms "spaces" 123 in a substrate 101 in a tight pitch structure without compromising the structure and/or integrity of adjacent spaces 123. Depending on the fill material of the spaces 123 and the material of the substrate 101, the spaces 123 can be formed into, for example, conductive vias or other conductive or contact structures at a close pitch with respect to each other. In the case of forming conductive or contact structures, the fill material of the spaces 123 can be, for example, copper, aluminum, cobalt or other electrically conductive material, and the substrate 101 can be a dielectric material. Alternatively, if the substrate 101 is a semiconductor material, the spaces 123 can be filled with a dielectric material to form isolation regions or other insulating structures at a close pitch with respect to each other for a semiconductor device. The close (or tight) pitch can be for example, 20 nm to 60 nm between adjacent spaces.

Figure 15:
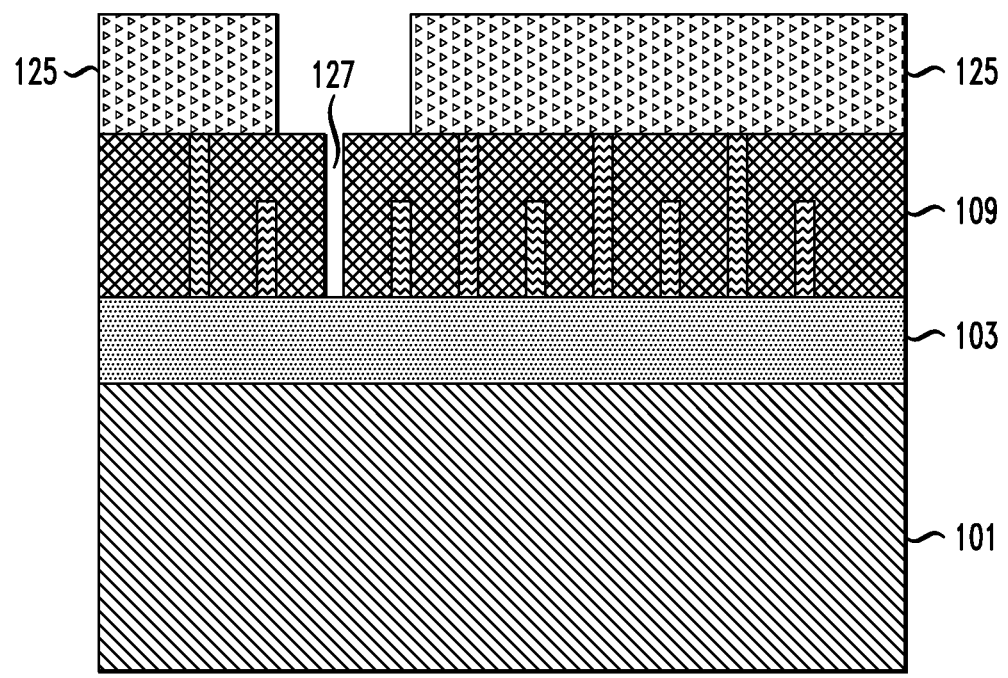
FIG. 15 is a cross-sectional view illustrating mask formation and removal of an exposed spacer from the first set of spacers in a method of manufacturing a semiconductor device in a method of manufacturing a semiconductor device, according to an exemplary embodiment of the present invention.

FIG. 15 is a cross-sectional view illustrating mask formation and removal of an exposed spacer from the first set of spacers in a method of manufacturing a semiconductor device in a method of manufacturing a semiconductor device, according to an exemplary embodiment of the present invention. Referring to FIG. 15, following from FIG. 4, a mask 125, such as, for example, a photoresist including an optical planarization layer (OPL), is formed on the mandrel material layer 109. The mask 125 leaves exposed a top surface of a spacer 107 of the first set of spacers that is to be removed, and covers remaining spacers 107 of the first set of spacers that would be exposed at the top surface of the mandrel material layer 109. Depending on design constraints, and the desired resulting structure of lines and/or spaces, any number of spacers 107 can be left exposed to be removed. Without a mask, the top surfaces of the first set of spacers 107, which are at a greater height than the second set of spacers 107', are exposed at a top surface of the layer 109. An etching process that selectively removes a material of the exposed spacer 107 (e.g., oxide) with respect to the mandrel material layer 109 (e.g. a-Si) is performed to create a gap 127 in the mandrel material layer 109. The selective removal can be performed using, for example, an oxide dry etch (e.g., chemical oxide removal (COR)) or a wet etch process including hydrofluoric acid, and is performed down to the hardmask layer 103.

Figure 16:
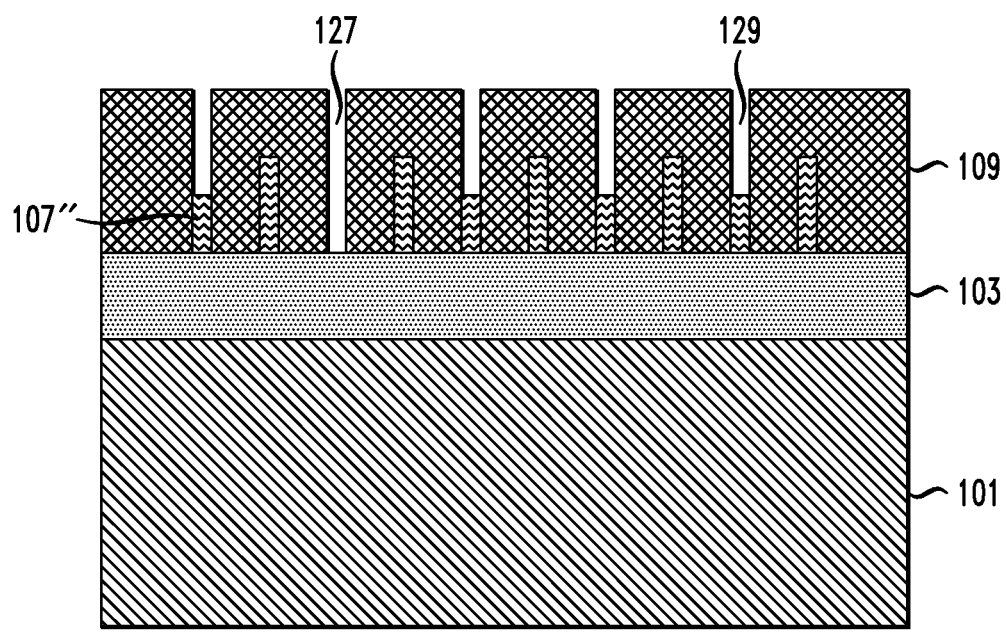
FIG. 16 is a cross-sectional view illustrating mask removal and partial removal of the exposed first set of the spacers to form a third set of the spacers having a height less than that of the second set of spacers in a method of manufacturing a semiconductor device, according to an exemplary embodiment of the present invention.

FIG. 16 is a cross-sectional view illustrating mask removal and partial removal of the exposed first set of the spacers to form a third set of the spacers having a height less than that of the second set of spacers in a method of manufacturing a semiconductor device, according to an exemplary embodiment of the present invention. Referring to FIG. 16, after the processing in FIG. 15 and removal of the mask 125, top surfaces of the first set of spacers 107, which are at a greater height than the second set of spacers 107', are exposed at a top surface of the layer 109. An etching process that selectively removes a material of the spacers 107 (e.g., oxide) with respect to the mandrel material layer 109 (e.g. a-Si) is performed to create gaps 129 in the mandrel material layer 109. The selective removal is stopped after partially removing the spacers 107 to create a third set of spacers having spacers 107" with a height that is less than a height of the spacers 107' of the second set of spacers.

Figure 17:
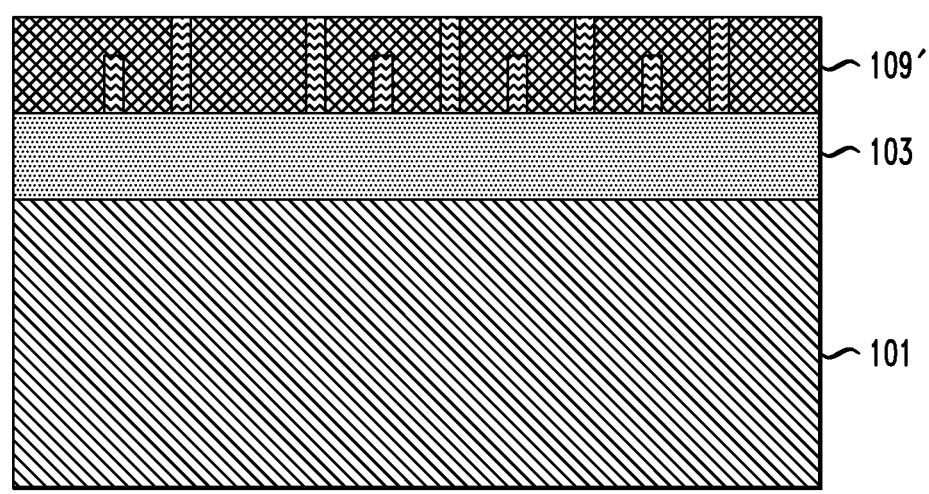
FIG. 17 is a cross-sectional view illustrating mandrel material deposition to fill in vacant areas on the hardmask layer and planarization to a height of the second set of spacers in a method of manufacturing a semiconductor device, according to an exemplary embodiment of the present invention.

FIG. 17 is a cross-sectional view illustrating mandrel material deposition to fill in vacant areas on the hardmask layer and planarization to a height of the second set of spacers in a method of manufacturing a semiconductor device, according to an exemplary embodiment of the present invention. Referring to FIG. 17, the mandrel material, such as a-Si, is deposited on the structure from FIG. 16 to create a layer 109' in which vacant areas on the hardmask layer 103 have been filled in. The deposited layer 109' is planarized to the top surface of the second set of spacers 107" to result in the structure shown in FIG. 17. The mandrel material can be deposited using deposition techniques, including, but not limited to, CVD, LPCVD, PECVD, RFCVD, PVD, ALD, MLD, MBD, PLD, LSMCD, spin-on, and/or sputtering, and the planarization can be performed using, for example, CMP.

Figure 18:
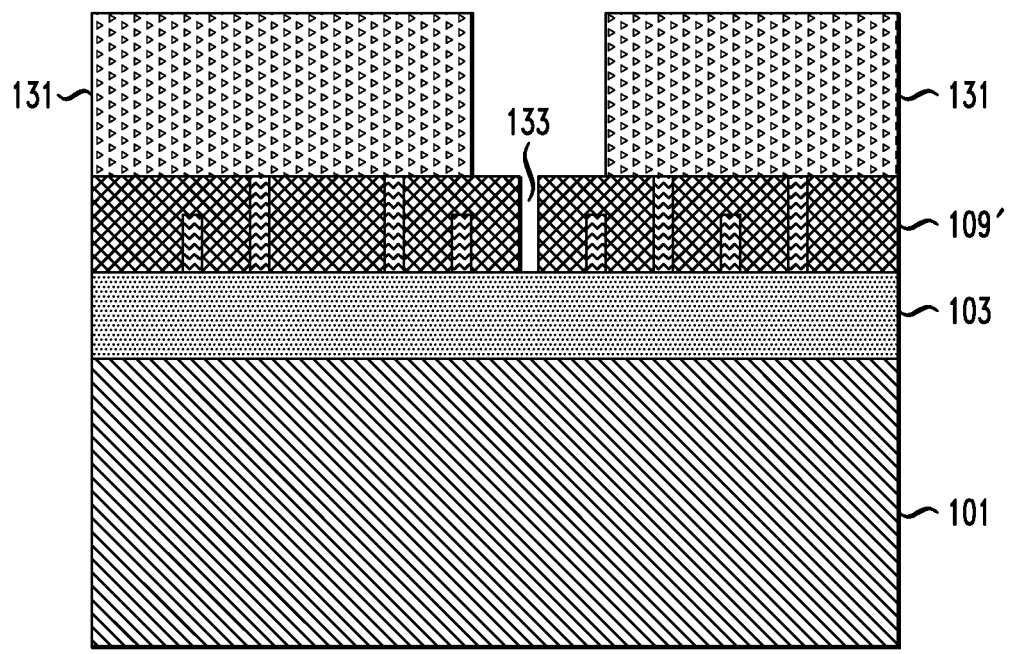
FIG. 18 is a cross-sectional view illustrating mask formation and removal of an exposed spacer from the second set of spacers in a method of manufacturing a semiconductor device, according to an exemplary embodiment of the present invention.

FIG. 18 is a cross-sectional view illustrating mask formation and removal of an exposed spacer from the second set of spacers in a method of manufacturing a semiconductor device, according to an exemplary embodiment of the present invention. Referring to FIG. 18, a mask 131, such as, for example, a photoresist including an optical planarization layer (OPL), is formed on the mandrel material layer 109'. The mask 131 leaves exposed a top surface of a spacer 107' of the second set of spacers that is to be removed, and covers remaining spacers 107' of the second set of spacers that would be exposed at the top surface of the mandrel material layer 109'. Depending on design constraints, and the desired resulting structure of lines and/or spaces, any number of spacers 107' can be left exposed to be removed. Without a mask, the top surfaces of the second set of spacers 107', which are at a greater height than the third set of spacers 107", are exposed at a top surface of the layer 109'. An etching process that selectively removes a material of the exposed spacer 107' (e.g., oxide) with respect to the mandrel material layer 109' (e.g. a-Si) is performed to create a gap 133 in the mandrel material layer 109'. The selective removal can be performed using, for example, oxide dry etch (e.g., chemical oxide removal (COR)) or a wet etch process with hydrofluoric acid, and is performed down to the hardmask layer 103.

Figure 19:
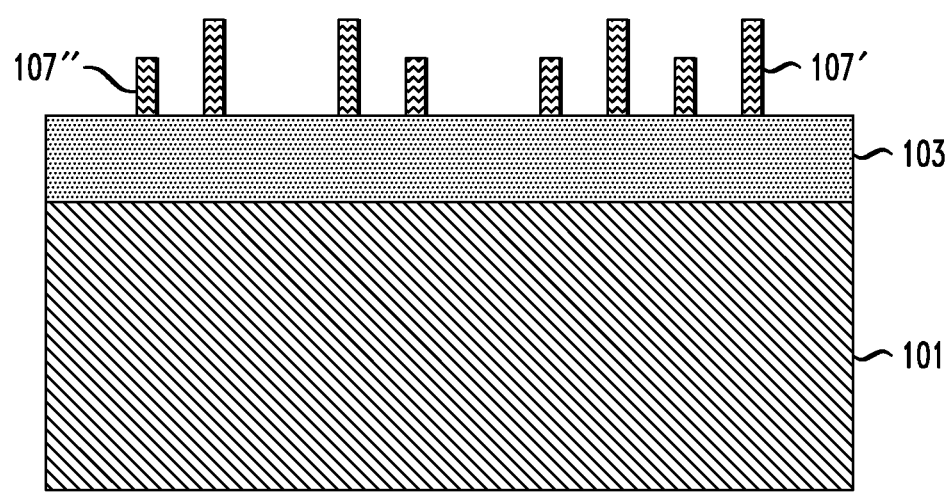
FIG. 19 is a cross-sectional view illustrating removal of a-Si from on the hardmask layer in a method of manufacturing a semiconductor device, according to an exemplary embodiment of the present invention.

FIG. 19 is a cross-sectional view illustrating removal of a-Si from on the hardmask layer in a method of manufacturing a semiconductor device, according to an exemplary embodiment of the present invention. Referring to FIG. 19, the mandrel material layer 109' (e.g., a-Si) is removed from the hardmask layer 103 using, for example, an isotropic etching process with hydrofluoric acid (HF), or other appropriate etchant. As can be seen, spacers 107' and 107" of the second and third sets of spacers that have not been removed remain on the hardmask layer 103.

Figure 20:
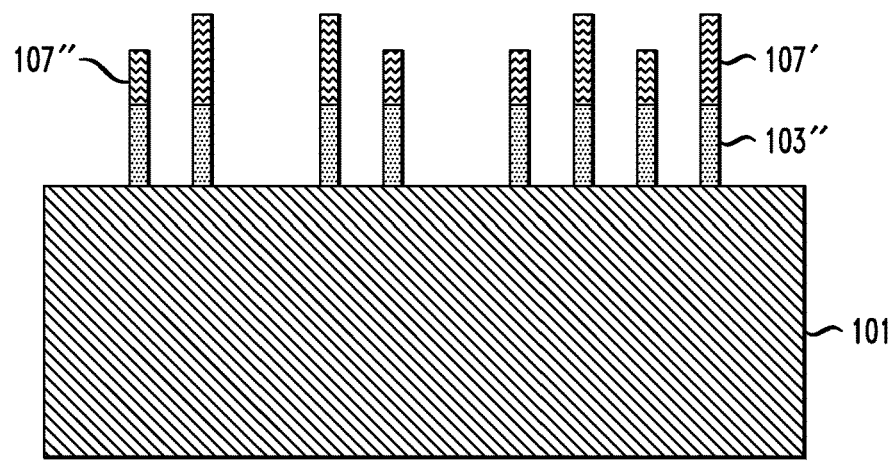
FIG. 20 is a cross-sectional view illustrating removal of exposed portions of the hardmask layer not covered by the remaining second and third sets of spacers in a method of manufacturing a semiconductor device, according to an exemplary embodiment of the present invention.

FIG. 20 is a cross-sectional view illustrating removal of exposed portions of the hardmask layer not covered by the remaining second and third sets of spacers in a method of manufacturing a semiconductor device, according to an exemplary embodiment of the present invention. Referring to FIG. 20, using the remaining second and third sets of spacers 107', 107" as masks, exposed portions of the hardmask layer 103 not covered by the remaining second and third sets of spacers 107', 107" are removed using a hardmask etch. The hardmask etch transfers the pattern of the remaining second and third sets of spacers 107', 107" to the hardmask layer to form patterned hardmask portions 103". In accordance with an embodiment of the present invention, hardmask layer 103 including SiN can be selectively etched with respect to the spacers 107', 107" using, for example, a silicon nitride RIE process.

Figure 21:
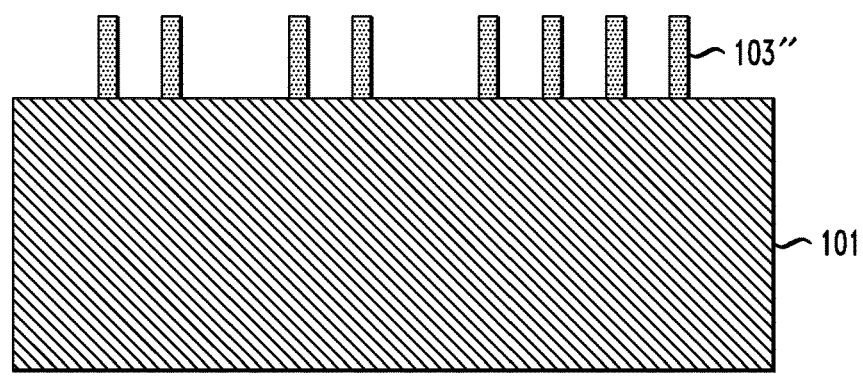
FIG. 21 is a cross-sectional view illustrating removal of the remaining second and third sets of spacers in a method of manufacturing a semiconductor device, according to an exemplary embodiment of the present invention.

FIG. 21 is a cross-sectional view illustrating removal of the remaining second and third sets of spacers in a method of manufacturing a semiconductor device, according to an exemplary embodiment of the present invention. Referring to FIG. 11, the remaining second and third sets of spacers 107', 107" are removed from the patterned hardmask portions 103" using, for example, a wet etch process including hydrofluoric acid (HF).

Figure 22:
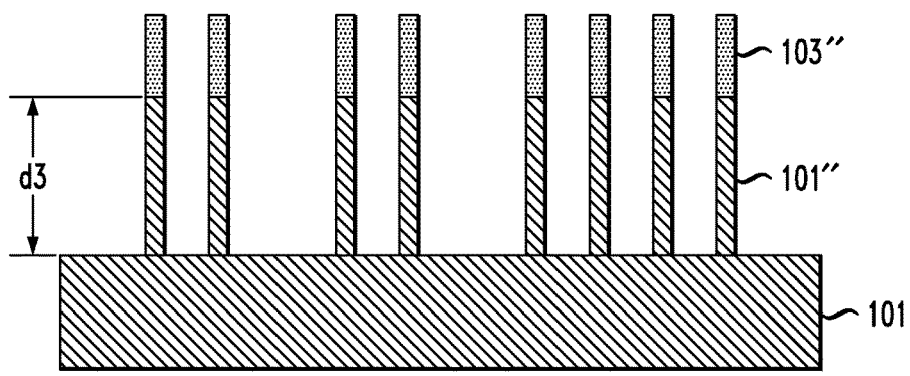
FIG. 22 is a cross-sectional view illustrating removal of exposed portions of the substrate not covered by the remaining portions of the hardmask layer to form lines in a method of manufacturing a semiconductor device, according to an exemplary embodiment of the present invention.

FIG. 22 is a cross-sectional view illustrating removal of exposed portions of the substrate not covered by the remaining portions of the hardmask layer to form lines in a method of manufacturing a semiconductor device, according to an exemplary embodiment of the present invention. Referring to FIG. 22, using the patterned hardmask portions 103" as masks, exposed portions of the substrate 101 not covered by the hardmask portions 103" are removed to certain depth d3 (depending on design) using a substrate etch. The substrate etch transfers the pattern of the remaining hardmask portions 103" to the substrate to form patterned substrate portions 101". In accordance with an embodiment of the present invention, substrate 101 including a semiconductor material, such as, Si, SiGe, SiC, Si:C, SiGeC, SiGe:C, III-V, II-V compound semiconductor or other like semiconductor, can be selectively etched with respect to the hardmask portions 103" using, for example, a silicon RIE process, and substrate 101 including a dielectric material, such as, but not necessarily limited to, SiOCH can be selectively etched with respect to the hardmask portions 103" using, for example, $CF_4$ or $N_2/H_2$ plasma.

In the embodiment described in connection with FIG. 22, like the embodiment described in connection with FIG. 12, the processing forms lines in a tight pitch structure without compromising the structure and/or integrity of adjacent lines. Depending on the material of the substrate 101, and, therefore, the resulting material of the lines 101", the lines 101" can form, for example, semiconductor fins or other semiconductor structures at a close pitch with respect to each other. Alternatively, if the substrate 101 is a dielectric material, the lines 101" may form isolation regions or other insulating structures for semiconductor device at a close pitch with respect to each other. The close (or tight) pitch can be for example, 20 nm to 60 nm between adjacent lines.

Figure 23:
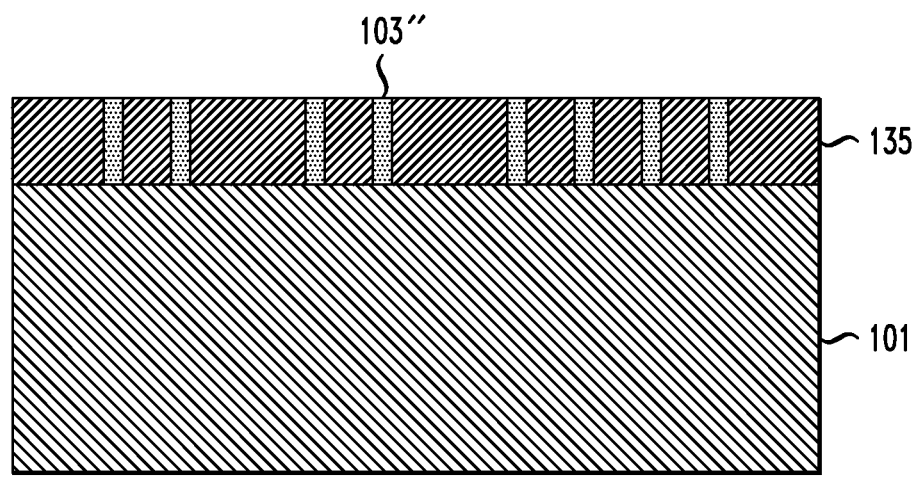
FIG. 23 is a cross-sectional view illustrating formation of a dielectric layer on the substrate and around remaining portions of the hardmask layer in a method of manufacturing a semiconductor device, according to an exemplary embodiment of the present invention.

FIG. 23 is a cross-sectional view illustrating formation of a dielectric layer on the substrate and around remaining portions of the hardmask layer in a method of manufacturing a semiconductor device, according to an exemplary embodiment of the present invention. Following from FIG. 21, a dielectric layer 135 is formed on the substrate 101 and around remaining hardmask layer portions 103". The dielectric layer 135 can comprise a material so that the hardmask layer portions 103" can be selectively removed with respect to the dielectric layer 135. For example, according to an embodiment of the present invention, the dielectric layer 135 comprises an oxide, and the hardmask layer portions 103" comprise SiN.

The dielectric layer 135 can be deposited using deposition techniques, including, but not limited to, CVD, LPCVD, PECVD, RFCVD, PVD, ALD, MLD, MBD, PLD, LSMCD, spin-on, and/or sputtering. The deposition can be followed by a planarization process, such as CMP, in order to planarize a top surface of the dielectric layer 135 to be coplanar with the top surfaces of the hardmask layer portions 103".

Figure 24:
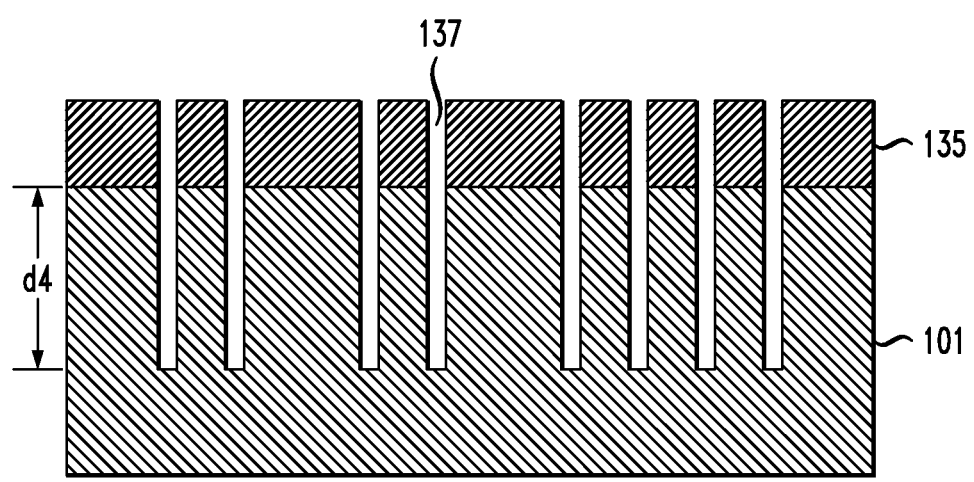
FIG. 24 is a cross-sectional view illustrating selective removal of the remaining portions of the hardmask layer and underlying portions of the substrate to form spaces (e.g., vacant areas) in a method of manufacturing a semiconductor device, according to an exemplary embodiment of the present invention.

FIG. 24 is a cross-sectional view illustrating selective removal of the remaining portions of the hardmask layer and underlying portions of the substrate to form spaces (e.g., vacant areas) in a method of manufacturing a semiconductor device, according to an exemplary embodiment of the present invention. Referring to FIG. 24, the hardmask layer portions 103" (e.g., SiN) are selectively removed with respect to the dielectric layer 135 (e.g., oxide) using, for example, a wet etch process including phosphoric acid, to form trenches in the dielectric layer 135.

The exposed portion of the substrate 101 (exposed by the trenches formed by the removal of the hardmask layer portions 103") are then removed down to a depth d4 (depending on design) using a substrate etch to form the openings 137, effectively transferring the pattern of the hardmask layer portions 103" to the substrate 101. Depending on the material of the substrate 101, the etching of the substrate 101 to form openings 137 is selective with respect to the material of the dielectric layer 135. In accordance with an embodiment of the present invention, substrate 101 including a semiconductor material, such as, Si, SiGe, SiC, Si:C, SiGeC, SiGe:C, III-V, II-V compound semiconductor or other like semiconductor, can be selectively etched with respect to the dielectric layer 135 using, for example, a silicon RIE process, and substrate 101 including a dielectric material, such as, but not necessarily limited to, SiOCH can be selectively etched with respect to the dielectric layer 135 using, for example, $CF_4$ or $N_2/H_2$ plasma.

In the embodiment described in connection with FIG. 24, like the embodiment described in connection with FIG. 14, the processing forms spaces 137 in a substrate 101 in a tight pitch structure without compromising the structure and/or integrity of adjacent spaces 137. Depending on the fill material of the spaces 137 and the material of the substrate 101, the spaces 137 can be formed into, for example, conductive vias or other conductive or contact structures at a close pitch with respect to each other. In the case of forming conductive or contact structures, the fill material of the spaces 137 can be, for example, copper, aluminum, cobalt or other electrically conductive material, and the substrate 101 can be a dielectric material. Alternatively, if the substrate 101 is a semiconductor material, the spaces 137 can be filled with a dielectric material to form isolation regions or other insulating structures at a close pitch with respect to each other for a semiconductor device. The close (or tight) pitch can be for example, 20 nm to 60 nm between adjacent spaces.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a hardmask layer on a substrate;
    forming a plurality of spacers on the hardmask layer, wherein the plurality of spacers comprise a first set of spacers and a second set of spacers;
    reducing a height of each spacer of the second set of spacers to be less than a height of each spacer of the first set of spacers;
    removing one or more spacers from at least one of the first set of spacers and the second set of spacers;
    transferring a pattern of remaining spacers to the hardmask layer to form a plurality of patterned hardmask portions;
    transferring a pattern of the plurality of patterned hardmask portions to the substrate to form one of a plurality of patterned substrate portions and a plurality of openings in the substrate;
    forming a plurality of mandrels on the hardmask layer, wherein the plurality of spacers are formed on sides of the plurality of mandrels; and
    depositing a mandrel material on the hardmask layer to fill in vacant areas formed by the reducing of the height of each spacer of the second set of spacers.

2. The method according to claim 1, further comprising planarizing the mandrel material so that a top surface of the mandrel material is coplanar with a top surface of each spacer of the first set of spacers.

3. The method according to claim 2, wherein the removing of the one or more spacers from at least one of the first set of spacers and the second set of spacers comprises selectively removing each spacer of the first set of spacers with respect to the mandrel material.

4. The method according to claim 3, further comprising forming a plurality of dielectric material portions on the hardmask layer in place of the removed first set of spacers, wherein the plurality of dielectric material portions can be selectively etched with respect to a material of the plurality of spacers.

5. The method according to claim 4, further comprising selectively removing one or more of the plurality of dielectric material portions with respect to the second set of spacers.

6. The method according to claim 5, further comprising transferring a pattern of remaining dielectric material portions to the hardmask layer to form an additional plurality of patterned hardmask portions.

7. The method according to claim 4, wherein the removing of the one or more spacers from at least one of the first set of spacers and the second set of spacers comprises selectively removing a spacer of the second set of spacers with respect to the plurality of dielectric material portions.

8. The method according to claim 2, further comprising forming a mask on the planarized mandrel material, wherein the mask leaves exposed a spacer of the first set of spacers.

9. The method according to claim 8, wherein the removing of the one or more spacers from at least one of the first set of spacers and the second set of spacers comprises removing the exposed spacer of the first set of spacers with respect to the mandrel material.

10. The method according to claim 2, further comprising removing a portion of each spacer of the first set of spacers to reduce a height of each spacer of the first set of spacers to be less than a height of each spacer of the second set of spacers.

11. The method according to claim 10, further comprising further planarizing the mandrel material so that a top surface of the mandrel material is coplanar with a top surface of each spacer of the second set of spacers.

12. The method according to claim 10, further comprising forming a mask on the further planarized mandrel material, wherein the mask leaves exposed a spacer of the second set of spacers.

13. The method according to claim 12, wherein the removing of the one or more spacers from at least one of the first set of spacers and the second set of spacers comprises removing the exposed spacer of the second set of spacers with respect to the mandrel material.

14. The method according to claim 1, wherein the substrate comprises one of a semiconductor material and a dielectric material.

15. A method for manufacturing a semiconductor device, comprising:
    forming a hardmask layer on a substrate;
    forming a plurality of spacers on the hardmask layer, wherein the plurality of spacers comprise a first set of spacers and a second set of spacers;
    reducing a height of each spacer of the second set of spacers to be less than a height of each spacer of the first set of spacers;
    removing one or more spacers from at least one of the first set of spacers and the second set of spacers;
    transferring a pattern of remaining spacers to the hardmask layer to form a plurality of patterned hardmask portions; and
    transferring a pattern of the plurality of patterned hardmask portions to the substrate to form one of a plurality of patterned substrate portions and a plurality of openings in the substrate;
    wherein the removing of the one or more spacers from at least one of the first set of spacers and the second set of spacers comprises removing each spacer of the first set of spacers.

16. The method according to claim 15, further comprising forming a plurality of dielectric material portions on the hardmask layer in place of the removed first set of spacers, wherein the plurality of dielectric material portions can be selectively etched with respect to a material of the plurality of spacers.

17. A method for manufacturing a semiconductor device, comprising:
    forming a hardmask layer on a substrate;
    forming a plurality of mandrel portions on the hardmask layer;
    forming a plurality of spacers on sides of the plurality of mandrel portions;
    reducing a height of each spacer on a first side of each mandrel portion of the plurality of mandrel portions so that spacers on opposite sides of each mandrel portion have different heights from each other;
    removing one or more spacers of the plurality of spacers;
    transferring a pattern of remaining spacers to the hardmask layer to form a plurality of patterned hardmask portions; and
    transferring a pattern of the plurality of patterned hardmask portions to the substrate to form one of a plurality of patterned substrate portions and a plurality of openings in the substrate.

18. A method for manufacturing a semiconductor device, comprising:
    forming a plurality of amorphous silicon (a-Si) portions on a hardmask layer;
    forming a plurality of dielectric spacers on sides of the plurality of a-Si portions;
    reducing a height of each spacer on a first side of each a-Si portion of the plurality of a-Si portions so that spacers on opposite sides of each a-Si portion have different heights from each other;
    removing one or more spacers of the plurality of spacers;
    using a pattern of remaining spacers on the hardmask layer as masks, removing exposed portions of the hardmask layer to form a plurality of patterned hardmask portions; and
    forming one of a plurality of patterned substrate portions and a plurality of openings in the substrate corresponding to the plurality of patterned hardmask portions.

* * * * *